(12) United States Patent
Emde et al.

(10) Patent No.: US 10,054,298 B2
(45) Date of Patent: Aug. 21, 2018

(54) LAMP OR DISPLAY COMPRISING AT LEAST ONE LIGHT PANEL ON A CARRIER PLATE

(71) Applicant: Emdedesign GMBH, Frankfurt am Main (DE)

(72) Inventors: Thomas Emde, Frankfurt am Main (DE); Christoph Petersen, Lich (DE); Jonathan Meier, Frankfurt am Main (DE); Günther Irlbacher, Schönsee (DE); Alexander Stoppa, Schönsee (DE)

(73) Assignee: Emdedesign GmbH, Frankfurt am Main (DE)

( * ) Notice: Subject to any disclaimer, the term of this patent is extended or adjusted under 35 U.S.C. 154(b) by 136 days.

(21) Appl. No.: 15/104,986

(22) PCT Filed: Dec. 16, 2014

(86) PCT No.: PCT/DE2014/100448
§ 371 (c)(1),
(2) Date: Jun. 16, 2016

(87) PCT Pub. No.: WO2015/090279
PCT Pub. Date: Jun. 25, 2015

(65) Prior Publication Data
US 2016/0320033 A1    Nov. 3, 2016

(30) Foreign Application Priority Data

Dec. 16, 2013  (DE) .................. 10 2013 114 115
May 14, 2014   (DE) .................. 10 2014 106 760

(51) Int. Cl.
*F21V 21/108*    (2006.01)
*F21V 21/08*     (2006.01)
(Continued)

(52) U.S. Cl.
CPC ............ *F21V 21/0808* (2013.01); *F21V 3/08* (2018.02); *F21V 19/042* (2013.01); *G02B 5/0242* (2013.01); *H01L 25/048* (2013.01); *H01L 27/3293* (2013.01); *H01L 51/0097* (2013.01); *H01L 51/5268* (2013.01);
(Continued)

(58) Field of Classification Search
CPC .. F21V 21/0808; F21V 3/0463; F21V 19/042; H01L 51/5275; H01L 51/5268; H01L 51/0097; H01L 25/048; H01L 27/3293; H01L 2251/5369; H01L 2251/5338; G02B 5/0242; F21Y 2109/00; F21Y 2103/20
See application file for complete search history.

(56) References Cited

FOREIGN PATENT DOCUMENTS

DE    202009016123 U1    2/2010
WO    2013/017372 A1     2/2013

*Primary Examiner* — Sonji Johnson
(74) *Attorney, Agent, or Firm* — Michael Soderman

(57) ABSTRACT

A lamp or display is comprised of at least one light panel (10) on a carrier plate (13) comprising at least one light panel (10) in the form of an OLED illuminant, lying on or against an at least partially light-permeable carrier plate (13) of the lamp in a planar manner. A liquid or viscous medium (11) is arranged between the adjacent surfaces of the light panel (10) and of the light-permeable carrier plate (13), and the connection between the light panel (10) and the carrier plate is an adhesive connection, which can be easily undone without destroying or adversely affecting the carrier plate (13).

15 Claims, 5 Drawing Sheets

(51) Int. Cl.
*F21V 19/04* (2006.01)
*H01L 25/04* (2014.01)
*H01L 27/32* (2006.01)
*G02B 5/02* (2006.01)
*H01L 51/00* (2006.01)
*H01L 51/52* (2006.01)
*F21V 3/08* (2018.01)
*F21Y 105/00* (2016.01)
*F21Y 115/15* (2016.01)
*F21Y 109/00* (2016.01)
*F21Y 103/20* (2016.01)

(52) U.S. Cl.
CPC ...... *H01L 51/5275* (2013.01); *F21Y 2103/20* (2016.08); *F21Y 2105/00* (2013.01); *F21Y 2109/00* (2016.08); *F21Y 2115/15* (2016.08); *H01L 2251/5338* (2013.01); *H01L 2251/5361* (2013.01); *H01L 2251/5369* (2013.01); *H01L 2924/0002* (2013.01); *Y02B 20/36* (2013.01)

LAMP OR DISPLAY COMPRISING AT LEAST ONE LIGHT PANEL ON A CARRIER PLATE

CROSS REFERENCE TO RELATED APPLICATIONS

This application is the U.S. national stage of International Application No. PCT/DE2014/100448, filed on 2014 Dec. 16. The international application claims the priority of DE 102013114115.3 filed on 2013 Dec. 16 and the priority of DE 102014106760.6 filed on 2014 May 14; all applications are incorporated by reference herein in their entirety.

BACKGROUND

The present invention relates to a lamp or a display comprising at least one light panel in the form of an OLED illuminant, lying on or against at least one partially light-permeable carrier plate of the lamp in a planar manner.

Light panels in terms of the above-mentioned definition comprise light-emitting OLED panels (OLED light panels), which can be fitted into lighting systems as well as OLED display panels, i.e. OLED panels which have a display function and are suitable for reproducing stationary images (photos, advertising etc.) or moving images (films, videos etc.).

Organic LEDs, called OLED hereunder, have been known for some years and up to now were used mainly in the display sector. The reason for this is that up till recently the luminous flux emitted by the OLEDs was not sufficient for the purpose of general lighting. Therefore OLEDs could only be used for supplementary lighting or effect lighting. Moreover manufacturing costs of OLEDs, until a few years ago, were very high, to the extent that it was not economic to use them for the purpose of general lighting. Recently however, ever more effective OLEDs with increasing light yield have been developed with production costs steadily decreasing.

Messrs. Philips for example are offering flat OLED panels under the name "lumiblade GL 350", which for a size of 124.5×124.54 mm deliver a luminous flux of 120 lumen white light, which for example is quite sufficient for a table lamp or other applications in the field of residential lighting (see publication in the internet (http://www.philips.de/light-community/trends/oled/lumibladeoledgl350.wpd.)

With OLED panels of the type mentioned the OLED stack itself is usually arranged on a carrier plate consisting of glass or plastic. If such an OLED panel is to be integrated with a lamp, it is obvious to attach the one or more OLED panels to a light-permeable carrier plate. The problem with this is, however, that when placing the OLED panel against the light-permeable carrier plate, wherein two planar surfaces are in contact with each other, a thin layer of air always forms between these two surfaces. This layer of air has proved to be a nuisance due to the fact that during light extraction from the flat OLED panel into the flat carrier plate the loss of light is considerable, a fact which is due to the layer of air between the flat OLED panel and the flat carrier plate, which comprises a refractive index different from that of the carrier plates. This negative effect is present both when surfaces are directly placed together and when both surfaces are treated, for example, with a diffuser layer through matting, structuring or applying a film. The loss of light is due to reflection or total reflection between the two planar elements.

One objective of the development on which the present invention is based therefore consisted in urging this layer of air out of the way and in replacing it by a refractive index which is as close as possible to that of the planar carrier plate.

In principle it would be possible to glue the light panel flat against the light-permeable carrier plate, which however is technically difficult. On the one hand this leads to air inclusions, and on the other to a loss of light due to the adhesive layer between the two planar elements. A further disadvantage consists in the fact that as a result of gluing the light panel onto the light-permeable carrier plate of the lamp, the light panel can no longer be detached from the carrier plate of the lamp. For inspection purposes however, a separable connection would be advantageous.

The older publication DE 10 2012 214 478 A1 not pre-published relative to the present application has disclosed an elongated light module with sealed luminous band, which comprises a first lower partial region consisting of an LED band on a circuit board, which is sealed into a polymer compound. A thin adhesive layer is applied to the top of this lower partial region. Further, a second partial region is provided, which forms a diffusely reflecting light-permeable body and consists of a polymer compound such as a silicone. The bonding agent for connecting the two partial regions may be a liquid silicone. During the manufacture of this lamp module however, the two partial regions are heated, then the adhesive layer is applied to one of the partial regions, then both partial regions are joined face to face, followed by the entire assembly being heated e.g. in an oven. In this way a permanent material bond is created between the two partial regions, which cannot be undone. The lower partial region, in which the LEDs are sealed, consists of a light-impermeable polymer compound, since light emission is intended only in an upward direction in the area of an emitter surface of the polymer compound so that the light is emitted into the light-permeable body of the second partial region.

In the DE 11 2011 104 636 T5 a light-emitting assembly with a plurality of electroluminescent elements with a substrate is described. This known light-emitting device is very thin, film-like and flexible and can therefore serve as a planar illuminant which is applied to the curved surface of the lamp shade of a lamp or can be used as a kind of luminous wallpaper on a wall. During layer construction a synthetic resin layer may also be applied to a substrate serving as a carrier for the film, wherein instead of a synthetic resin a liquid with a high index of refraction may be used. After deposition this layer is however hardened by heat or light so that a material bond is formed between the substrate and the light-emitting layers. A sealing layer is then applied onto the top of the layer assembly of the light-emitting layers in order to protect the functional layers. Following manufacture the substrate and the layers applied to it form an inseparable unit, which is used as a luminous film, and no provision is made, nor would it be meaningful to provide for a separation between the substrate (of the carrier layer) and the functional layers, because this would mean a destruction of the product.

The DE 20 2009 016 123 U1 describes an electroluminescent film composite, in which an electroluminescent element is applied to a glass or a plastic film as a carrier, wherein the element is permanently attached to the carrier substrate by means of an adhesive layer, which covers the same on the top and overhangs on the edges. Above the electroluminescent element there extends a protective film laminate, which is also held fast by the adhesive layer on the carrier substrate. The adhesive layer used may consist, for example, of a hot-melt adhesive. A refractive index of 1.40 to 1.52 for the adhesive layer is cited. This known product too is a permanent film composite wherein it is not envisaged that the connection between the carrier substrate and the electroluminescent element could again be undone. Rather provision is made for the topside of the film composite glued to the substrate to be effectively cleaned, because the composite is provided for use in external areas, such as for gluing onto cars. It would therefore be counterproductive if the carrier substrate separated from the electroluminescent element during cleaning, as this would lead to a destruction of the luminous film.

SUMMARY

A lamp or display is comprised of at least one light panel (10) on a carrier plate (13) comprising at least one light panel (10) in the form of an OLED illuminant, lying on or against an at least partially light-permeable carrier plate (13) of the lamp in a planar manner. A liquid or viscous medium (11) is arranged between the adjacent surfaces of the light panel (10) and of the light-permeable carrier plate (13), and the connection between the light panel (10) and the carrier plate is an adhesive connection, which can be easily undone without destroying or adversely affecting the carrier plate (13).

DETAILED DESCRIPTION

At this point it is pointed out that the requirement of the present invention consists in applying one or more complete functional flat panel-like OLED illuminants to a supporting plate (carrier plate) of a lamp or a display in a planar manner such that the one or more OLED illuminants can be removed e.g. for inspection purposes from the carrier plate without undue expense. The carrier plate therefore is part of the lamp and not part of the illuminant. By contract, in the previously mentioned state of the art, the illuminant itself is at stake, wherein this is of layer construction with a plate as a substrate onto which an OLED stack is placed, which because of the sensitivity of the OLED layers towards oxygen and moisture, according to the present state of the art, must always be covered on the top by an encapsulation layer.

The requirement of the invention consists in providing a lamp or a display comprising at least one light panel of the generic kind mentioned in the beginning, lying on or against at least one partially light-permeable carrier plate in a planar manner, wherein a full-surface connection or an at least partial-surface connection is given between light panel and carrier plate for a minimised loss of light, and wherein it is possible, at the same time, to undo the connection between light panel and carrier plate.

The solution to the above requirement is a lamp or display comprising at least one OLED panel lying flat on an at least partially light-permeable carrier plate with the characteristics of claim 1.

According to the invention a liquid or viscous adhesive medium is arranged between two adjacent surfaces of OLED panels (also called light panel herein) and the light-permeable carrier plate, and the connection between the light panel and the carrier plate is an adhesive connection which is easily separable not leading to destruction or other adverse effects. This is to be understood in the sense that the light panel can be lifted off the carrier plate without a great deal of force, e.g. manually or using a simple tool and in doing so, separate the connection. A comparatively small adhesive force supplied by the liquid or viscous adhesive is sufficient to hold the OLED light panel in position on the carrier plate, because there are no noticeable forces acting on the connection. In this way the illuminant, should it be defective, is easily replaced, in that the light panel is simply lifted off the carrier plate. This is advantageous in comparison to a glued connection, where usually a non-destructive separation of the connection is not possible or where at any rate residues of the adhesive would remain on the carrier plate and/or the light panel. The solution according to the invention is also advantageous compared to a screw connection, for no holes have to be bored into the carrier plate which in particular would adversely affect the aesthetic appearance of the lamp. Also no mechanical fastening elements are required which would have to be concealed, as required.

The above-mentioned term "viscous" in relation to the adhesive medium does not only include highly viscous liquids but e.g. also paste-like media with low flowability.

OLED panels known from the state of the art often comprise a diffuser film glued to the light-emitting side which is provided for the purpose of evening out the light emission with regard to the spatial directions in which the light is emitted. It has however become evident that using such a diffuser film is always accompanied by a certain amount of loss of light. The present invention therefore advantageously proposes to remove this diffuser film and to achieve the diffusion of light for direction-independent light emission by diffusing means which are present in the adhesive medium. This reveals a further advantage of the solution according to the invention, which offers the possibility of utilising the adhesive medium for this additional function. Preferred possibilities for light diffusion through the adhesive medium will be discussed further below.

The adhesive medium in terms of the present invention can, in principle, be any liquid or viscous medium, which meets the said characteristics as regards the refractive index and is suitable to produce sufficient adhesion between the adjacent surfaces of light panel and light-permeable carrier plate, in order to connect these permanently but nevertheless separably with each other, in such a way that as far as possible no air inclusions form between the adjacent surfaces of light panel and carrier plate.

The solution according to the invention combines a number of advantages. Firstly, an adhesive connection is created between the light panel and the light-permeable carrier plate, which makes it possible to connect both components with each other in a planar manner without running the risk of incurring interfering air inclusions, which would a. o. reduce the light yield and would negatively affect the optical appearance. Secondly, this connection between the two components is very easily undone when required, so that for example for inspection purposes, e.g. in the case of a functional fault of the light panel, the light panel can, without problems, be detached from the carrier plate and replaced. The third advantage consists in that this replacement can be carried out by anyone without much ado, without having to return the device to the manufacturer. The fourth essential advantage is that annoying reflections and total reflections of the light between the planar elements are cancelled out or minimised.

Preferably the adhesive agent comprises a refractive index which deviates only slightly from quartz glass, in particular a refractive index of about 1.3 to about 1.6. In the present application, various media of liquid adhesive agent are cited e.g. further below, the refractive indices of which fall within the said range, in particular within a range of about 1.40 to about 1.52, which is especially favourable for the invention. Experiments in terms of the development of the subject of the invention have shown that when using a medium, which has a refractive index very similar to that of the material of the carrier plate and that of the lowest layer of the light panel (glass in most cases), the light emitted in the interface regions of light panel and carrier plate passes through substantially unhindered. This is totally different with air inclusions which occur in the above-mentioned solutions, since the refractive index of air is about 45% less than that of glass.

According to a further development of the invention it is preferred if the adhesive medium used is a substantially colourless and/or clear liquid with an oil-like viscosity, wherein in particular the dynamic viscosity, at ambient temperature, may lie between about 50 and about $10^5$ mPas.

Furthermore it is possible to temporarily heat the adhesive medium prior to or during contacting of the two surfaces, in order to briefly increase flowability, so that later, e.g. at ambient temperature, a higher viscosity of the adhesive medium can be obtained.

Furthermore it is possible to add to the medium materials such as diffuser particles and/or luminescent materials and/or pigments or similar materials, in order to e.g. influence the light or to influence the properties of the adhesive medium e.g. with regard to viscosity, ageing resistance, UV resistance or similar. Furthermore this adhesive medium can be utilised as an electrical insulator between the two surfaces.

For example, according to a preferred further development of the invention, the adhesive medium may be an organic material, in particular a material selected from the group comprising alcohols, multi-valent alcohols, hydrocarbons, hydrocarbon mixtures, oils, fats, ketones, aldehydes and esters as well as mixtures therefrom. The said organic materials, apart from a similar refractive index such as glass, should have only a minimal capacity for absorbing or dispersing the passing light, and should show a chemically neutral behaviour towards the material of the carrier plate and that of the light panel, and their optical properties should not negatively change even as a result of temperature effects in the adhesive layer between the two components.

It is especially preferred if the adhesive medium contains an organic liquid or a viscous organic substance selected from the group of low-viscosity paraffin, high-viscosity paraffin, Vaseline, petroleum, glycerine, glycol, cyclohexanone, silicone oil, siloxanes as well as mixtures therefrom. Furthermore natural oils such as vegetable oils may be considered.

Alternatively ionic liquids may be used as an adhesive medium, wherein these may be salts which occur in liquid form at temperatures of e.g. below 100° C. without the salt having been dissolved in a solvent such as water. These are e.g. organic salts with alkylated cations. These ionic liquids do not evaporate, have a high heat conductance and are permanently stable.

Preferably at least the surface of the light-permeable carrier plate, which faces the light panel or is to be separably connected therewith (and coated if required), consists of glass or plastic glass, in particular acrylic glass, and preferably also a carrier layer of the light panel, which faces the light-permeable carrier plate and is to be separably connected therewith, consists of possibly coated glass or plastic glass, in particular acrylic glass.

Alternatively a carrier plate may be used, which itself comprises diffuser qualities, and here materials would be considered such as highly diffusing acrylic glass or ceramic materials, for example carrier plates with glass balls or silicate crystals in a light-permeable or transparent ceramic colour. Also, the use of carrier plates consisting of etched glasses could be considered, which cause a high degree of light diffusion.

An alternative solution variant of the present invention, which is the subject of claim 9, provides for the adhesive medium to be gelatinous or gel-like, wherein for example a gel film may be used. Therefore the adhesive medium could be a viscoelastic fluid. If a gel film is used, this should be a non-stick gel film so that the connection between carrier plate and OLED panel in terms of the invention can be undone again. Here silicone gels such as on the basis of polydimethyl siloxane (PDMS) could be considered, or gels or gel films of another chemical composition, for example those with agar as the main constituent, those on the basis of cellulose ethers and water, silicone gels or silica gels, manufactured e.g. from water glass, gels or gel films of modified polyimides or similar.

With this variant the procedure may be such that e.g. a silicone gel is applied to the OLED panel, which then hardens, and then this OLED panel is placed with the gel layer side onto the carrier plate. It may then happen that the OLED panel cannot later be separated again from the adhesive medium without problems, which however would not be a disadvantage because one should, in case of an inspection, assume that the OLED panel is defective. Nevertheless even here the connection between the adhesive medium and the carrier plate can be separated again later without problems, so that the OLED panel can be replaced without negatively affecting the carrier plate.

Gels such as silicone gels are very suitable for receiving diffuser particles since these are fixed in a polymer matrix and therefore prevented from sinking into (being unevenly distributed in) the adhesive medium. The desired properties such as for example diffusion or transmission can be adjusted by selecting the correct size and concentration of the diffuser particles. In these cases of application diffuser particles in concentrations of about 0.5% to about 10% per weight in the gel would be suitable.

The diffuser particles used may, for example, be in the form of micro hollow balls made of glass with diameters in the range of about 10 µm to about 120 µm or silicate crystals, which ensure a very even distribution of the light emitted by the OLED panels without any noticeable losses of light.

Silicone oils and silicone gels as an adhesive medium have the advantage that they are non-toxic, physiologically harmless, odourless, chemically inert, thermally stable in the range of about −60° C. to about 300° C., UV-stable, hydrophobic, non-volatile and electrically insulating and have refractive indices within a range of about 1.4.

According to a preferred further development of the solution according to the invention, the light-permeable carrier plate to which one or more light panels are attached, is part of a lighting unit such as an external light or an internal light, in particular a pendant light, hanging light, ceiling-mounted light, ceiling-recessed light, standing light, wall light or table light. Furthermore other applications may be, for example, lighting shelves or lighting panels, parts of a furniture item, facade elements, wall elements, ceiling elements, external lights, internal lights or fittings in motor vehicles, rail vehicles, ships, aeroplanes etc. Preferably one or more light panels are arranged on the top of at least one partially light-permeable carrier plate of such a light.

A lighting unit according to the present invention may for example be: an external light or internal light, in particular a pendant light, hanging light, ceiling-mounted light, ceiling-recessed light, standing light or table light, a lighting shelf, lighting panel, a furniture item, an urban space furniture item, façade element, wall element, ceiling element, a fitting in the living area, in the office area, in motor vehicles, rail vehicles, ships, aeroplanes or the like, with the above-described features.

A subject of the present invention is further a display device (screen function) for reproducing stationary or moving images such as photos, films videos, advertising such as on a mobile phone, on a monitor, screen, TV-device, camera display etc., comprising an adhesive medium with the above described features and arranged between a carrier plate and at least one OLED panel, wherein this display device may also be part of a furniture item, an urban space furniture item, façade element, ceiling element, wall element, a fitting in the living area or in offices, or part of a motor vehicle, rail vehicle, ship, aeroplane or the like.

A subject of the present invention may also be e.g. a combination of one or more light-emitting surfaces (lighting surfaces) with one or more displace surfaces.

Furthermore it is possible to provide the light panel, e.g. at least partially, with a diffuser layer by e.g. applying a film or by treating the surface, before the adhesive medium for connecting the two surfaces is applied.

The carrier plate, to which the light panel is attached, may, as required, also consist of a flexible carrier material, for example of a flexible glass or plastic.

The carrier plate of a lamp according to the invention preferably has at least one surface with the dimensions of an OLED panel currently available on the market, of e.g. 120 mm×120 mm, provided the panel is a rectangular OLED light panel. But the carrier plate may also have a round contour or may have other shapes, which deviate from that of the OLED panel. Furthermore the carrier plate is preferably a load-bearing plate of the lamp or display and is not part of the illuminant. Thus one could attach a suspension means for the lamp to the carrier plate if the lamp in question is a pendant lamp, or a foot stand if the lamp in question is a standing lamp or table lamp, or a bracket for a ceiling mounting or wall mounting, if the lamp is a wall lamp or ceiling lamp.

With a vertical or inclined alignment of the carrier plate such as in the case of wall lights, the adhesive medium must be chosen such that its adhesive strength is strong enough to hold the OLED panel(s) on the carrier plate in position. The weight force from the dead weight of the OLED panel must therefore be compensated for. Moreover, in the case of these applications, the consistency of the adhesive medium must be highly viscous to the extent where it is ensured that the adhesive medium does not inadvertently emerge from the connection region between carrier plate and OLED panel.

If two or more light panels are attached to the carrier plate as proposed according to the invention, the carrier plate preferably has appropriate dimensions, so that it is possible to glue a number of light panels to one of the surfaces of the same carrier plate. For example, according to a preferred further development of the present invention, a number of light panels can be arranged in one or more rows on one side of an at least partially light-permeable carrier plate.

With a ceiling light the light panels are preferably attached to the topside of the carrier plate, so that the light panels emit light right through the carrier plate in a downward direction. With a wall light, the light panels are preferably attached to the back of the carrier plate so that again the light is emitted right through the carrier plate. This variant has the additional advantage that light emission can be influenced by optical means in the area of the carrier plate (for example through light diffusion or evening out of the planar light output, in particular in the case of a number of light panels) and it is also possible to treat the carrier plate in various ways, such as by printing, coating, gluing, etching, sandblasting or inclusions in the carrier plate or other suitable methods, in such a way that fastening elements, electronic components, electrical components arranged on the rear side of the carrier plate, which faces away from the light-emitting side, are not or hardly recognisable on the exposed light-emitting side, whereby the aesthetic overall impression of the lamp is further improved.

In an especially preferred variant of the present invention provision is made for a second plate, a so-called cover plate, to be used for contacting the light panels. In order to avoid light losses, it is important that the light panels lie against one side of the carrier plate at a minimum distance. This contact surface, as a rule, is the surface on that side of the carrier plate, which faces away from the surface emitting the light, so that the light emitted passes through the carrier plate. It is of advantage if the light panels contact the carrier plate in such a way that their contacts lie on that side of the carrier plate, which faces away from the surface emitting the light, which means that the contacts do not point in direction of the carrier plate. With this advantageous variant one can therefore contact these contacts of the light panels via the cover plate. This means that the light panels are then sandwiched between the carrier plate and the cover plate. Contact elements or conductor tracks etc. for this contacting may e.g. be provided on that side of the cover plate, which faces the light panels.

According to a preferred further development of the invention dispersed diffuser particles are contained in the adhesive medium, which cause an optical scattering of light passing through the arrangement. The advantage of dispersed diffuser particles in the adhesive medium compared to the use of a diffuser film as known from the state of the art, consists in that such a diffuser film, as a rule, is glued full-surface onto a carrier plate, e.g. a light-emitting glass plate. On the one hand, this means that the connection can no longer be undone. Besides it was found, as part of experiments performed in the context of the present invention, that a liquid or viscous adhesive medium makes for better heat dissipation compared to a glued-on diffuser film. This may result e.g. in temperature differences of approx. 10-15° C. in comparison to the conventional solution. Since OLED illuminants are, as a rule, heat-sensitive, this improved heat dissipation leads to an increased life-span of the OLED illuminant.

The diffuser particles may, for example, be magnesium oxide, zinc oxide, titanium oxide, glass frits, aluminium stearate or other white or coloured materials, which are preferably present in the form of small particles with a particle size of e.g. less than 1 mm, for example, in the range of about 10 nm to about 120 μm.

The layer thickness of the adhesive layer varies widely depending on the adhesive medium, the type and size of the OLED panels used, the field of application and the type of illuminant. For example, layer thicknesses for the adhesive medium may be chosen, which lie within a range of less than one mm, in particular in the range of approx. 100 μm to approx. 300 μm or approx. 500 μm.

According to a further preferred variant of the invention the adhesive medium contains a colouring agent.

A possible preferred further development of the solution according to the invention combines both solution alternatives, i.e. the adhesive medium contains both diffuser particles and a colouring agent.

The colouring agent in the adhesive medium may comprise, for example, dispersed colour particles, in particular colour pigments or, for example, at least one colouring agent dissolved in the adhesive medium. In this way the light colour of the light emitted by the light panel can be changed in comparison to the original light colour of the illuminant used.

The features mentioned in the sub-claims relate to the preferred embodiments of the invention. Further advantages of the invention are revealed in the detailed description hereunder.

BRIEF DESCRIPTION OF THE DRAWINGS

The present invention will now be described in detail by way of exemplary embodiments with reference to the attached drawings, in which.

DETAILED DESCRIPTION OF THE PREFERRED EMBODIMENTS

Figure 1:
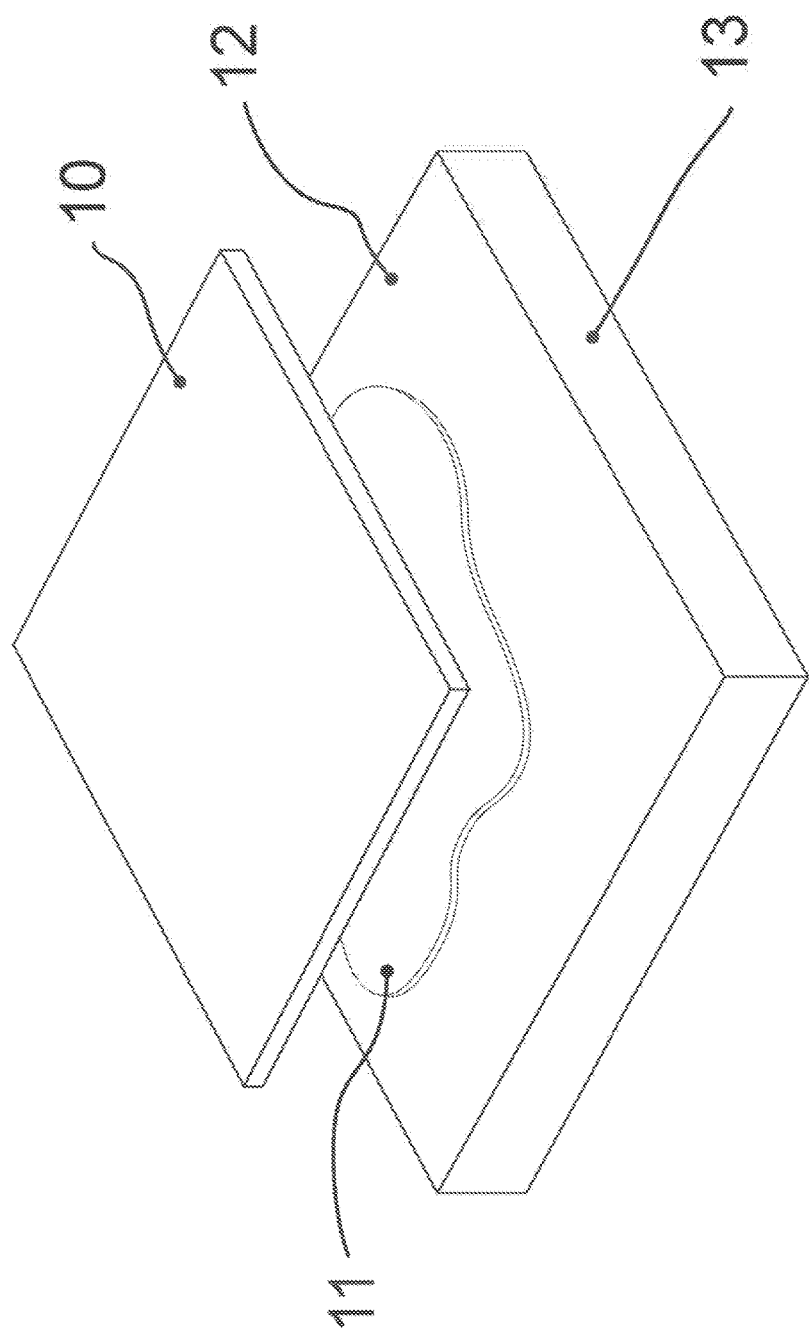
FIG. 1 shows a schematic perspective view of an exemplary lamp according to the invention prior to attaching an OLED panel to a carrier plate.

To start with, reference is made to FIG. 1 which shows a perspective and schematically strongly simplified view of an OLED panel 10 consisting for example of glass or plastic, which is attached in a planar manner by means of an adhesive medium 11 to a surface 12 of a carrier plate 13. The adhesive medium 11 may, for example, be a viscous oil-like liquid with a refractive index similar to that of the glass or plastic material of the carrier plate 13. When attaching the OLED panel 10 a suitable amount of adhesive medium is simply applied to the surface 12 facing the OLED panel 10, and distributed in the area of the surfaces to be connected, and then the OLED panel 10 is placed in the envisaged position onto the surface 12 of the carrier plate 13, in such a way that the connecting surfaces of the two plates (OLED panel and carrier plate) facing each other are wetted all over with the adhesive medium and so that no air inclusions occur in the interface area. The OLED panel then adheres to the carrier plate 13 by virtue of the adhesive force of the adhesive medium 11.

In order to ensure that the two plates are accurately fixed to each other, it usually makes sense to provide an additional mechanical connection, e.g. a separable clamping connection, thereby preventing the OLED panel from moving. The fastening elements/clamping elements used for this purpose are not shown in FIG. 1.

Figure 2:
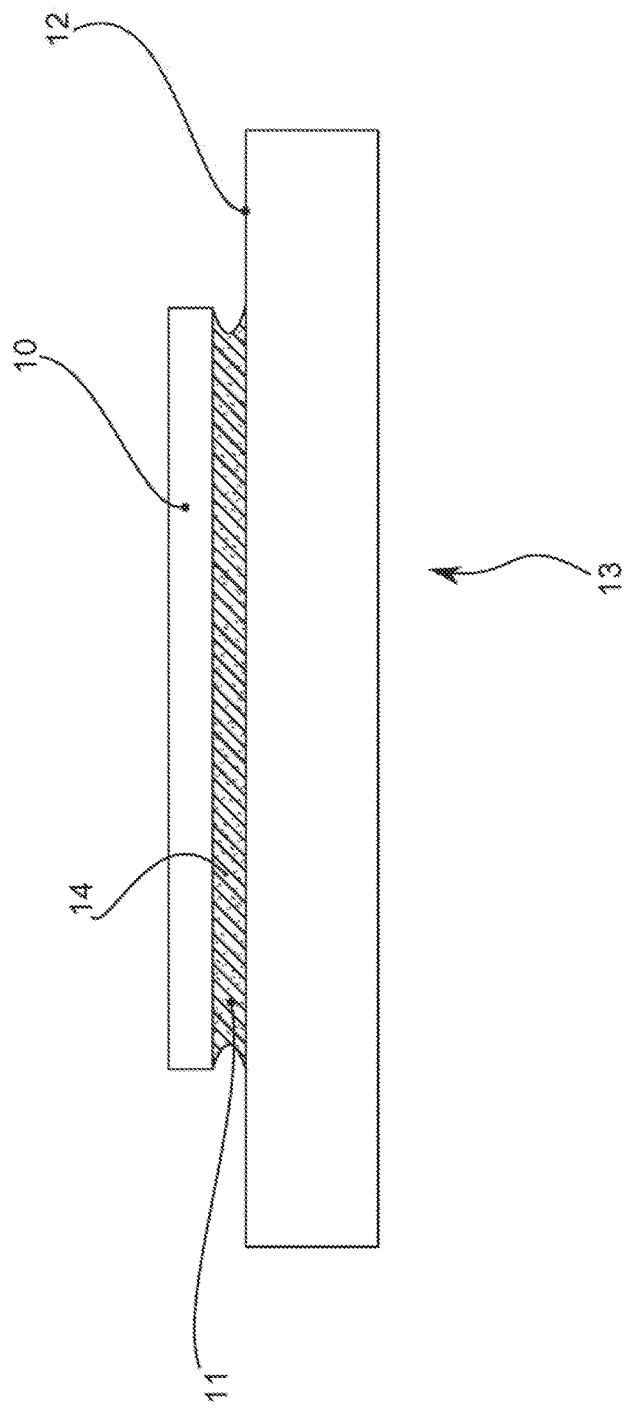
FIG. 2 shows a schematically simplified sectional view of an exemplary arrangement according to the invention with an OLED panel attached to a carrier plate.

FIG. 2 shows, in schematically simplified section, an OLED panel 10, which is attached in a planar manner by means of the adhesive medium 11 to the top surface 12 of a carrier plate 13. The connection according to the invention via the adhesive medium can be undone at any time without problems, usually with the aid of a tool, in that—possibly after undoing the clamping elements or other fastening elements—the OLED panel 10 is simply lifted off the carrier plate 13 in an upward direction. After maintenance work or possibly after cleaning of the surface 12 of the carrier plate 13 the OLED panel 10 can again be attached to the carrier plate 13 using a new adhesive medium 11.

As can be recognised in FIG. 2, with this variant the light (in case of a lighting device) or the image elements (in case of an OLED display) are emitted by the OLED panel through the carrier plate 13 in direction of the arrows, so that an observer looks at the surface opposite the OLED panel (the underside in the drawing of FIG. 2) of the carrier plate 13.

Dispersed diffuser particles 14 are contained in the adhesive medium, which cause an optical scattering of the light passing through the arrangement.

According to a variant of the present invention a colouring agent such as dispersed pigments or a colouring agent which can be dissolved in an adhesive medium, can be added to the adhesive medium 11, either alternatively or additionally to the diffuser particles 14, in order to, in this way, change the light colour of the light emitted by the OLED panel 10.

An exemplary alternative variant of a lamp according to the invention will now be explained with reference to FIGS. 3 and 4. This embodiment refers to a pendant light, where a number of OLED panels 10 with an approx. rectangular footprint are attached to e.g. an elongated rectangular carrier plate 22 consisting e.g. of glass or plastic glass. In the example there are three such OLED panels 10, but in principle the number of panels may be random. The OLED panels 10 may be arranged, as in this case, in a row or e.g. in a number of adjacent rows on the carrier plate 22. Here the OLED panels 10 are arranged one behind each other in a row in longitudinal direction. The dimensions of the carrier plate 22 in longitudinal direction are chosen such that a number of rectangular OLED panels fit on one carrier plate 22.

Since in this example the carrier plate 22 is part of a pendant light, the carrier plate extends horizontally when in use, so that the adhesive medium 11 can be applied to the top surface of the carrier plate 22 and then the OLED panels 10 can be placed simply onto the areas of the carrier plate 22, to which the adhesive medium was applied. The adhesive medium may be applied in a thin layer and distributes evenly due to the dead weight of the OLED panels 10 between the adjacent surfaces of the carrier plate 22 and OLED panel 10. Air inclusions between carrier plate and OLED panel are avoided. An adhesive connection is thus created which can be undone in a simple way as required, in that the OLED panel 10 is lifted off the carrier plate 22. Contacting of the OLED panels 10 in the embodiment shown in FIG. 3 may be via a cover plate 24, which for example may comprise dimensions similar to those of the carrier plate 22, and which comprises spring contacts 16, which are supplied with electric current via conductor tracks 17. These spring contacts 16 on the underside of the cover plate 24 are arranged such that when the cover plate 24 is positioned they contact the contacts of the OLED panels.

Figure 3:
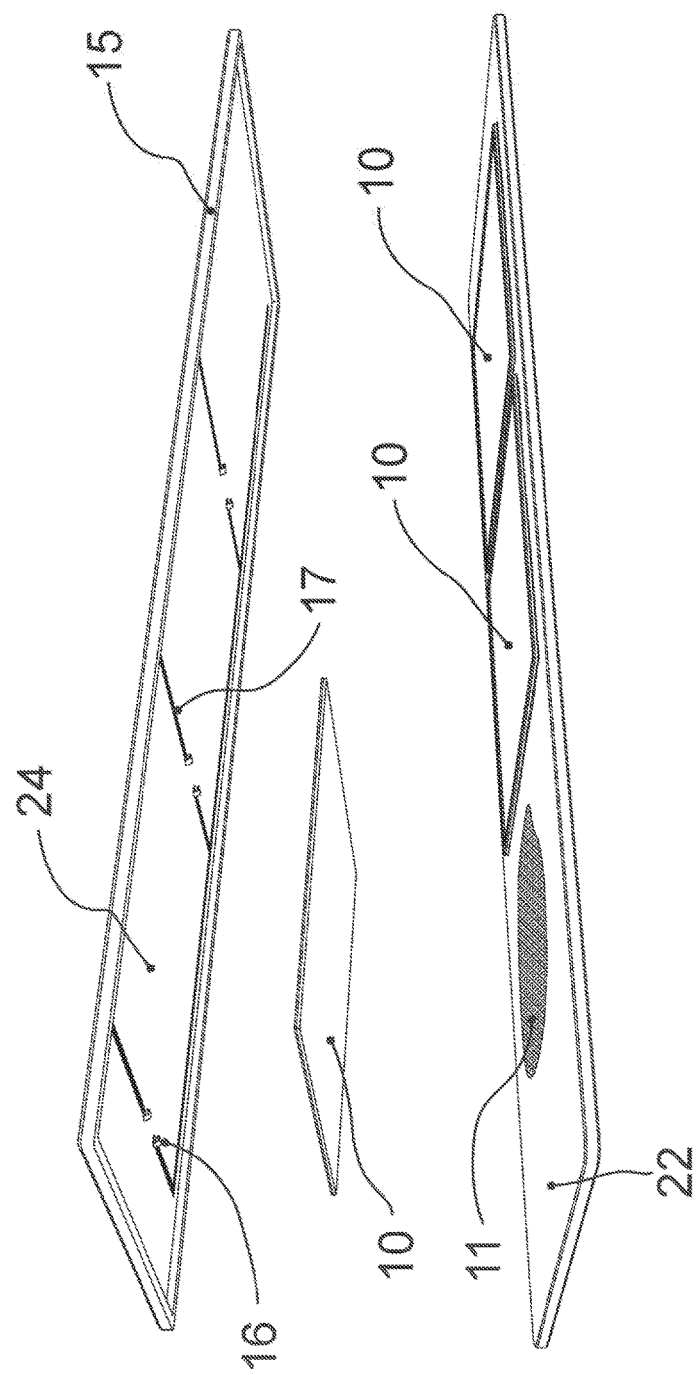
FIG. 3 shows a schematic perspective exploded view of a lamp according to an exemplary variant of the present invention.
Figure 4:
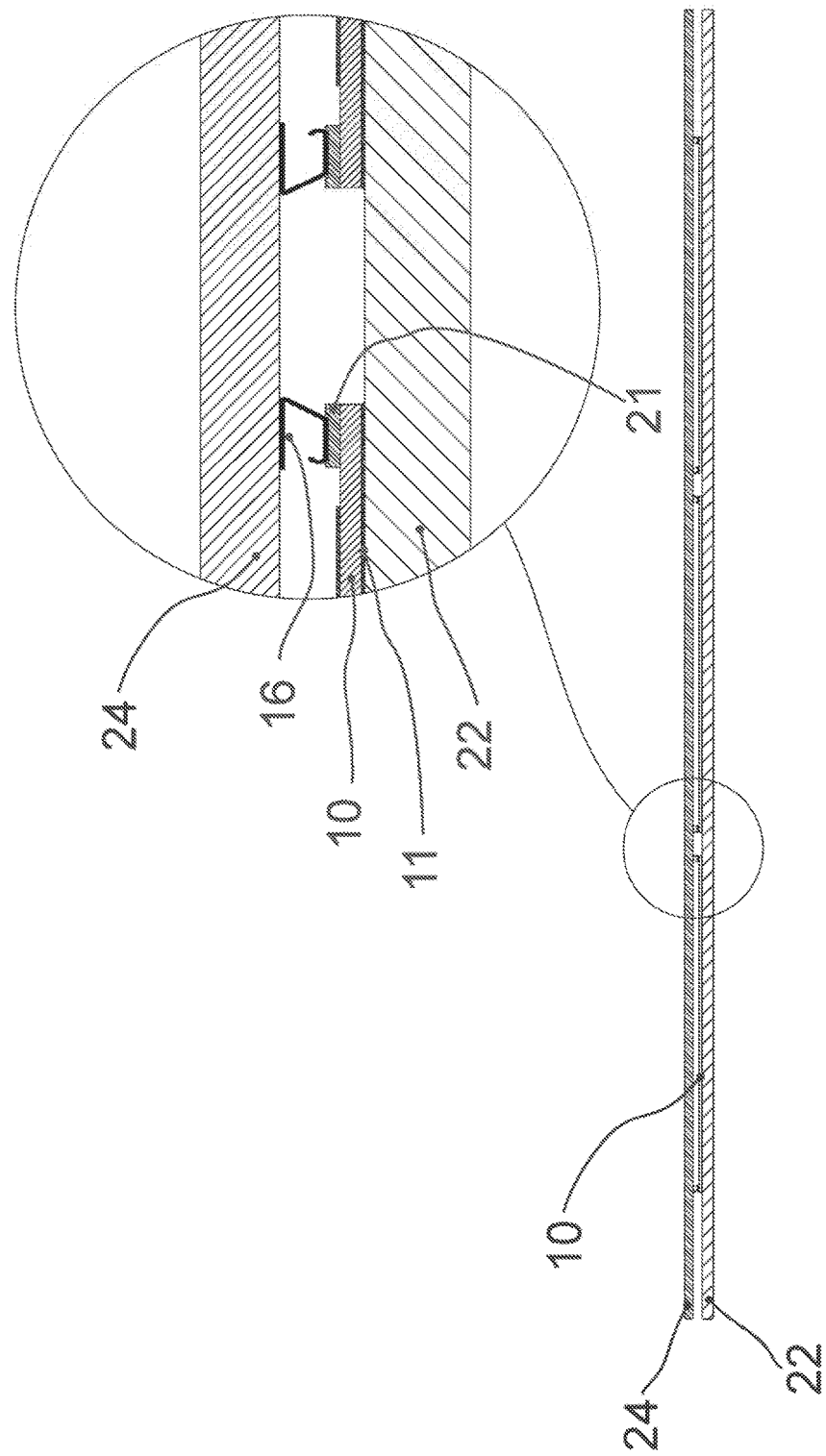
FIG. 4 shows a schematically simplified sectional view of a lamp according to the variant of FIG. 3, wherein a cut-out of this view is depicted on an enlarged scale.

This can be recognised very clearly in the detail view of FIG. 4, which shows a longitudinal section through the lamp of FIG. 3. Here one of the spring contacts 16 is shown on the underside of the cover plate 24. The OLED panels 10 usually have a frame 21 with contact surfaces in their outer edge regions, via which contacting takes place. The cover plate 24 itself has a frame 15, which can serve as a distance piece between carrier plate 22 and cover plate 24. A lamp of the kind shown in FIGS. 3 and 4 can thus be assembled in a very simple way. The carrier plate 22 can be used as a load-bearing component of the lamp, and in the case of a pendant lamp the suspension means for the lamp can be attached to the carrier plate 22. The respective number of required OLED light panels 10 are simply placed onto the carrier plate 22, then the cover plate 24 is placed onto the carrier plate 22 to which the OLED panels 10 have been fitted, which has the effect of establishing contact with the OLED panels and thus completing the assembly process. Further electronic and electrical components for the operation of the lamp as well as operating elements etc. can for example be housed in the area of the cover plate. The lamp is thus of simple construction, consists of only a few components and is designed very flat, resulting in a pleasing appearance. Its simple construction permits efficient production and cost-efficient assembly.

Figure 5:
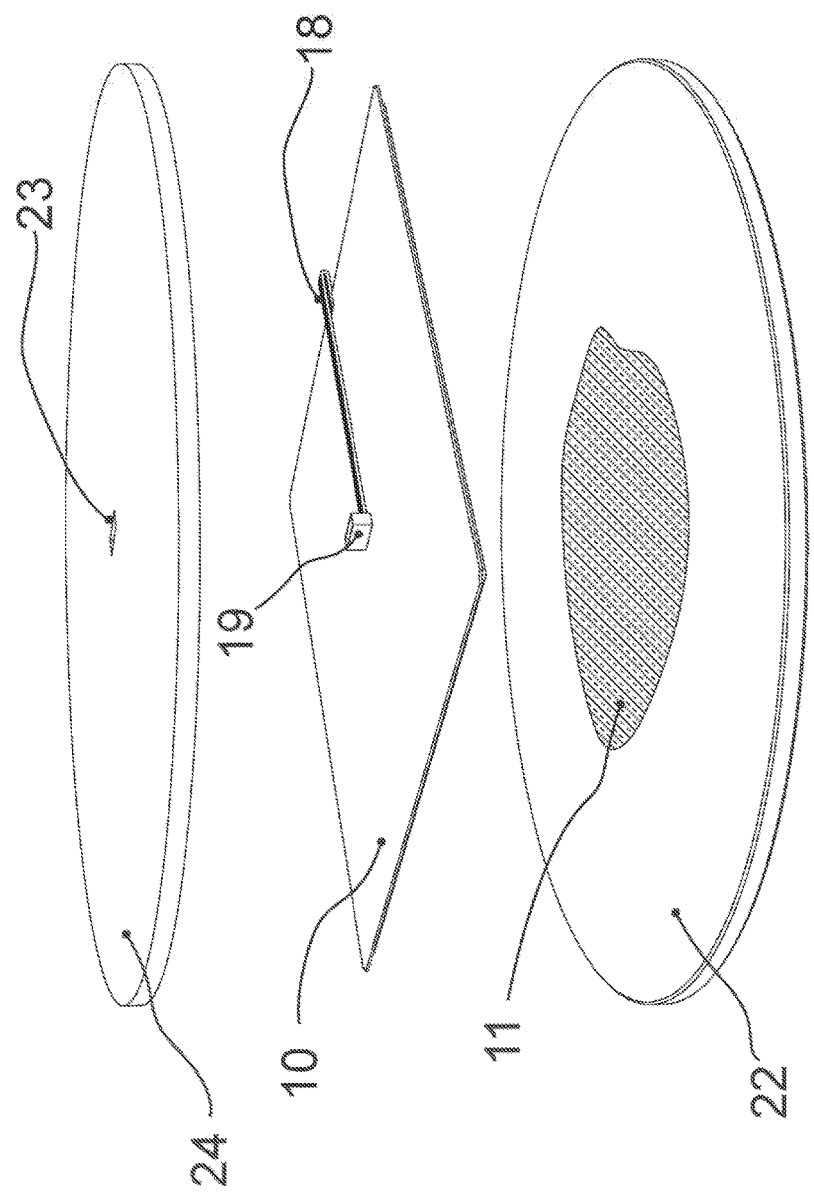
FIG. 5 shows a schematically simplified exploded view of a lamp according to a further variant of the present invention.

Another somewhat modified exemplary variant of the present invention will now be explained in detail with reference to FIG. 5. The figure shows a perspective explosive view and has been schematically simplified. In this exemplary embodiment the carrier plate 22 has a round contour the OLED panel 10 is rectangular in shape as in the above-described examples, but octagonal or round shapes are also feasible. Again, the adhesive medium 11 is applied to the carrier plate 22. Then the OLED panel 10 is placed onto the carrier plate 22. Here the carrier plate 22 is smaller and for example, only one OLED panel 10 is used. A cover plate 24, which also has a round contour, is placed onto the OLED panel, which lies on the carrier plate 22. This variant shows that lamps of different types and sizes and of different design can be constructed according to the same principle. Contacting of the OLED panels 10 is not effected here via the cover plate 24, but instead a cable 18 is provided, which leads to the contacts of the OLED panel 10. The electrical supply of the lamp may e.g. be effected via a socket 19 connected to the cable 18, into which a plug (not shown) is inserted. This socket 19 can extend through a recess 23 in the cover plate 24, so that when the lamp is assembled, an electrical connection is possible from outside.

LIST OF REFERENCE NUMERALS 10 light panel, in particular OLED panel
11 adhesive medium
12 top surface
13 carrier plate
14 diffuser particle
15 frame
16 spring contact
17 conductor track
18 cable
19 socket
21 frame with contact surfaces
22 carrier plate
23 recess
24 cover plate

The invention claimed is:

1. A lamp or display comprising at least one light panel (10) on a carrier plate (13) comprising at least one light panel (10) in the form of an OLED (organic light-emitting diode) illuminant, lying on or against an at least partially light-permeable carrier plate (13) of the lamp in a planar manner, characterised in that a liquid or viscous medium (11) is arranged between the adjacent surfaces of the light panel (10) and of the light-permeable carrier plate (13) and in that the connection between the light panel (10) and the carrier plate is an adhesive connection, which is easily undone without destroying or adversely affecting the carrier plate (13).

2. The lamp or display according to claim 1, characterised in that the adhesive medium (11) has a refractive index deviating only slightly from glass, in particular a refractive index within a range of approximately 1.3 to approximately 1.6.

3. The lamp or display according to claim 1, characterised in that the adhesive medium (11) comprises or is a substantially colourless and/or clear liquid with a dynamic viscosity at ambient temperature of about 50 to about $10^5$ mPas.

4. The lamp or display according to claim 1, characterised in that the adhesive medium (11) comprises or is an organic liquid, in particular selected from the group comprising alcohols, multi-valent alcohols, hydrocarbons, hydrocarbon mixtures, oils, fats, ketones, aldehydes and esters as well as mixtures therefrom.

5. The lamp or display according to claim 1, characterised in that the adhesive medium (11) contains or is an organic material selected from the group of low-viscosity paraffin, high-viscosity paraffin, Vaseline, petroleum, glycerine, glycol, cyclohexanone, silicone oil, siloxanes as well as mixtures therefrom.

6. The lamp or display according to claim 1, characterised in that the light-permeable carrier plate (13) facing the light panel (10) and to be separably connected therewith consists, as required, of coated glass or plastic glass, in particular acrylic glass.

7. The lamp or display according to claim 1, characterised in that the carrier layer of the light panel (10) facing the light-permeable carrier plate (13) and to be separably connected therewith consists, as required, of coated glass or plastic glass, in particular acrylic glass.

8. The lamp or display according to claim 1, characterised in that the light panel (10) comprises a LED illuminant or light-emitting micro-lens array or a display surface provided for the reproduction of stationary or moving images.

9. The lamp or display according to claim 1, characterised in that this lamp or display is an external light, an internal light, in particular a pendant light, hanging light, ceiling-mounted light, ceiling-recessed light, standing light, wall light or table light, or is a lighting shelf or lighting panel or part of a furniture item or urban space furniture item or a facade element, wall element, ceiling element, an external light of a motor vehicle or a fitting in a motor vehicle, rail vehicle, ship or aeroplane.

10. The lamp or display according to claim 1, characterised in that a number of light panels (10) are arranged in one or more rows on one side of an at least partially light-permeable carrier plate (13).

11. The lamp or display according to claim 1, characterised in that dispersed diffuser particles are contained in the adhesive medium (11), which cause an optical scattering of light passing through the array.

12. The lamp or display according to claim 1, characterised in that a colorant is contained in the adhesive medium (11).

13. The lamp or display according to claim 12, characterised in that the colorant comprises colour particles dispersed in the adhesive medium (11), in particular colour pigments, in particular fluorescent pigments.

14. The lamp or display according to claim 12, characterised in that the colorant comprises at least one colouring agent dissolved in the adhesive medium (11).

15. A lamp or display comprising at least one light panel (10) in the form of a OLED (organic light-emitting diode)

illuminant, lying on or against an at least partially light-permeable carrier plate (13) of the display in a planar manner, characterised in that a paste-like, gel-like or gelatinous adhesive medium (11) is arranged between the adjacent surfaces of light panel (10) and light-permeable carrier plate (13) and in that the connection between the light panel (10) and the carrier plate is an adhesive connection, which is undone without destroying or adversely affecting the light panel (10) or the carrier plate (13).

* * * * *